(12) United States Patent
Ben-Abu (10) Patent No.: US 9,808,915 B2
(45) Date of Patent: Nov. 7, 2017

(54) SELECTIVE VACUUM PRINTING MACHINE

(71) Applicant: CAMTEK LTD., Migdal Haemek (IL)

(72) Inventor: Yehuda Ben-Abu, Netanya (IL)

(73) Assignee: CAMTEK LTD., Migdal Haemeq (IL)

( * ) Notice: Subject to any disclaimer, the term of this patent is extended or adjusted under 35 U.S.C. 154(b) by 0 days.

(21) Appl. No.: 14/943,123

(22) Filed: Nov. 17, 2015

(65) Prior Publication Data

US 2016/0143151 A1 May 19, 2016

Related U.S. Application Data

(60) Provisional application No. 62/081,013, filed on Nov. 18, 2014.

(51) Int. Cl.
*B25B 11/00* (2006.01)
*H05K 13/00* (2006.01)
*H05K 3/12* (2006.01)

(52) U.S. Cl.
CPC ........ *B25B 11/005* (2013.01); *H05K 13/0061* (2013.01); *H05K 3/12* (2013.01); *H05K 2203/085* (2013.01)

(58) Field of Classification Search
CPC .............................. B25B 11/00; B25B 11/005
See application file for complete search history.

(56) References Cited

U.S. PATENT DOCUMENTS

| | | | | |
|---|---|---|---|---|
| 5,899,445 A * | 5/1999 | Kimble | ..................... | B25B 5/06 269/21 |
| 6,305,677 B1 * | 10/2001 | Lenz | ................... | H01L 21/6831 269/13 |
| 2010/0133735 A1 * | 6/2010 | Katsuta | .................. | B23Q 3/088 269/21 |
| 2016/0143151 A1 * | 5/2016 | Ben-Abu | ............. | H05K 3/0085 427/98.4 |

* cited by examiner

*Primary Examiner* — Lee D Wilson
(74) *Attorney, Agent, or Firm* — Reches Patents (57) ABSTRACT

A system that may include a apertured structure that is configured to support a substrate and a vacuum supply unit that is configured to (i) prevent a supply of vacuum to a first area of the substrate during a first processing period during which the first area is processed and a second area of the substrate is not processed; (ii) provide vacuum to the second area during the first processing period; (iii) prevent the supply of vacuum to the second area during a second processing period during which the second area is processed and the first area is not processed; and (iv) provide vacuum to the first area during the second processing period.

11 Claims, 13 Drawing Sheets

SELECTIVE VACUUM PRINTING MACHINE

CROSS REFERENCE TO RELATED APPLICATIONS

This application claims the priority of U.S. provisional patent 62/081,013 filing date Nov. 18, 2014 which is incorporated herein by reference.

BACKGROUND OF THE INVENTION

Different electronic substrates, such as printed circuit boards (PCBs) are manufactured by a complex manufacturing process during which various materials should be layered on the substrate by method of printing or any other known methods in order to produce electronic substrate such as PCB, wafer, die, flip-chip, etc. In addition, different electronic substrates may undergo repair processes or any other processes that require to place the substrate on a holding surface.

During some stages of the manufacturing process or repair of the substrate process or any similar processes the substrate can be placed on a holding table such as a vacuum table. A vacuum table provides mechanical support to the substrate and also applies vacuum on the entire substrate in order to flatten the surface area of the substrate and to firmly hold the substrate.

During various stages of the manufacturing process or repair processes the substrate has multiple holes (such as holes that are drilled for forming vias).

When materials are layered near the multiple holes the vacuum of the holding table may induce the printing material towards the multiple holes and may even suck the printing material into the hole.

There is a growing need to provide a system and method that allows layering materials on a surface of the substrate or any internal layers of the substrate without compromising the required quality of the substrate, while applying relatively strong vacuum levels or holding of the substrate by other means, thereby flattening the PCB and holding it firmly and layering the printed materials on the surface of the substrate.

SUMMARY

According to an embodiment of the invention there may be provided a system that may include a apertured structure that may be configured to support a substrate; a vacuum supply unit that may be configured to prevent a supply of vacuum to a first area of the substrate during a first processing period during which the first area may be processed and a second area of the substrate may be not processed; provide vacuum to the second area during the first processing period; prevent the supply of vacuum to the second area during a second processing period during which the second area may be processed and the first area may be not processed; and provide vacuum to the first area during the second processing period.

The vacuum supply unit may include (a) a blocking module that may be configured to selectively prevent the supply of vacuum and (b) a positioning module that may be configured to determine a position of the blocking module.

The system may include a first conduit for providing vacuum to the first area of the substrate; a second conduit for providing vacuum to the second area of the substrate; wherein the positioning module may be configured to position, during the first processing period, the blocking module at a first position thereby blocking the first conduit; and wherein the positioning module may be configured to position, during the second processing period, the blocking module at a second position thereby blocking the second conduit.

The first and second conduits may include first and second apertures; wherein the blocking module may be configured to block the first aperture during the first processing period and to block the second aperture during the second processing periods.

The first and second conduits may be tunnels that may be oriented to a longitudinal axis of chamber in which the blocking module moves.

The vacuum supply unit may include (a) multiple blocking modules that may be configured to selectively prevent the supply of vacuum and (b) multiple positioning modules that may be configured to determine positions of the multiple blocking modules.

The processing may include removing material from the substrate.

The processing may include printing material on the substrate.

The substrate may include a group of areas; wherein the group of areas includes the first areas, the second areas and at least one additional area; wherein each area of the group of areas may be processed only during an associated processing period of a group of processing periods; wherein during each processing period of the group of processing periods, the vacuum supply unit may be configured to prevent the supply of vacuum to the area of the substrate that may be being processed and supply vacuum to at least one area of the substrate that may be not processed.

According to an embodiment of the invention there may be provided a method for selective supplying of vacuum to a substrate, the method may include supporting the substrate by an apertured structure; preventing, by a vacuum supply unit, a supply of vacuum to a first area of the substrate during a first processing period during which the first area may be processed and a second area of the substrate may be not processed; providing, by the vacuum supply unit, vacuum to the second area during the first processing period; preventing, by the vacuum supply unit, the supply of vacuum to the second area during a second processing period during which the second area may be processed and the first area may be not processed; and providing, by the vacuum supply unit, vacuum to the first area during the second processing period.

The method may include selectively preventing, by a blocking module of the vacuum supply unit, the supply of vacuum, determining, by a positioning module of the vacuum supply unit, a position of the blocking module.

The method may include positioning the blocking module, by the positioning module and during the first processing period, at a first position thereby blocking a first conduit of the vacuum supply unit thereby preventing a supply of vacuum to the first area of the substrate; and positioning the blocking module, by the positioning module and during the second processing period, at a second position thereby blocking a second conduit of the vacuum supply unit thereby preventing a supply of vacuum to the second area of the substrate.

The first and second conduits may include first and second apertures; wherein the method may include blocking, by the blocking module, the first aperture during the first processing period and blocking, by the blocking module, the second aperture during the second processing periods.

The first and second conduits may be tunnels that may be oriented to a longitudinal axis of chamber in which the blocking module moves.

The method may include selectively preventing, by multiple blocking modules of the vacuum supply unit, the supply of vacuum; and determining, by multiple positioning modules of the vacuum supply unit, positions of the multiple blocking modules.

The processing may include removing material from the substrate.

The processing may include printing material on the substrate.

The substrate may include a group of areas; wherein the group of areas includes the first areas, the second areas and at least one additional area; wherein each area of the group of areas may be processed only during an associated processing period of a group of processing periods; wherein the method may include preventing, during each processing period of the group of processing periods and by the vacuum supply unit, the supply of vacuum to the area of the substrate that may be being processed and supplying vacuum to at least one area of the substrate that may be not processed.

BRIEF DESCRIPTION OF THE INVENTION

The present invention will be understood and appreciated more fully from the following detailed description taken in conjunction with the drawings in which.

DETAILED DESCRIPTION OF THE INVENTION

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

In the following text there are provided various non-limiting examples of substrates and processing operations. The substrate may be a PCB, a wafer, a solar panel and the like. The processing operation may include printing, adding missing material or removal of material, and the like.

There is provided a system that may apply desired vacuum levels (for example—as high as needed to flatten the PCB and hold it to the vacuum table) at areas that differ from a selected area and may reduce the vacuum level (and even block the suction completely) at the selected area—the corresponds to the area that is being printed (and optionally to a vicinity of the area that is being printed).

The areas of the substrate may be defined by the processing operation—an area is defined as an area that is being processed. The entire substrate or parts of the substrate may be processed during multiple processing periods. An area may be defined by the field of view of the processing device.

For example—a print head may print a strip of a substrate before printing another strip. In this case each strip may be viewed as a separate area. Yet according to another embodiment of the invention if a group of strips is printed while the substrate is stationary then the group of strips may be regarded as a single area. Alternatively—an area may be defined by the selectivity of the vacuum supply unit. If the vacuum supply unit may selectively provide vacuum to J different areas of the substrate than there are J areas and an area (of the J areas) is processed is any part of the area is processed.

If, for example, material is being printed by scanning the PCB one area of the other—the system may include a blocking mechanism that blocks the vacuum from being applied to these one area after the other.

For example, if the printing process is applied along a long and elongated area (for example—one line after the other) then the blocking mechanism blocks the vacuum from one area after the other.

The blocking mechanism may have a shape that corresponds to the area to be blocked. For example—when the areas that are being printed have a shape of a line—the blocking mechanism may have a rectangular shape. A blocking mechanism may be a rod, a plate or any other element.

The size of the blocking mechanism may be fixed or may vary according to the strength of vacuum applied and/or to the required accuracy of printing. Stronger vacuum and higher accuracies may require larger blocking mechanisms.

The blocking mechanism may be moved by a mechanical stage that is synchronized with the areas that are being printed. If, for example, the PCB is moved in relationship to the printing head of the system then the blocking mechanism may be static or—alternatively—may be moved.

If, for example, the PCB is moved along an X-axis and the print head is moved along a Y-axis then the blocking mechanism may remain static, may be moved along the X-axis and/or along the Y-axis. If, for example, the blocking mechanism spans along the entire width of the PCB (assuming that the longitudinal axis of the PCB is parallel to the X-axis) then the blocking mechanism may remain static.

The blocking mechanism may be placed underneath the upper surface of the vacuum table (such as not to contact the PCB position on the vacuum able)—but in a manner that blocks the vacuum from reaching the selected area.

For example—the vacuum table may include a lower part that provides the vacuum, an intermediate layer that may be hollow and in which the printing mechanism may move and an upper portion that contacts the PCB.

Yet for another example—the blocking mechanism may be static and may be formed at the upper surface of the vacuum table.

The system may have a controller for synchronizing the printing process and the location of the blocking mechanism.

Figure 1:
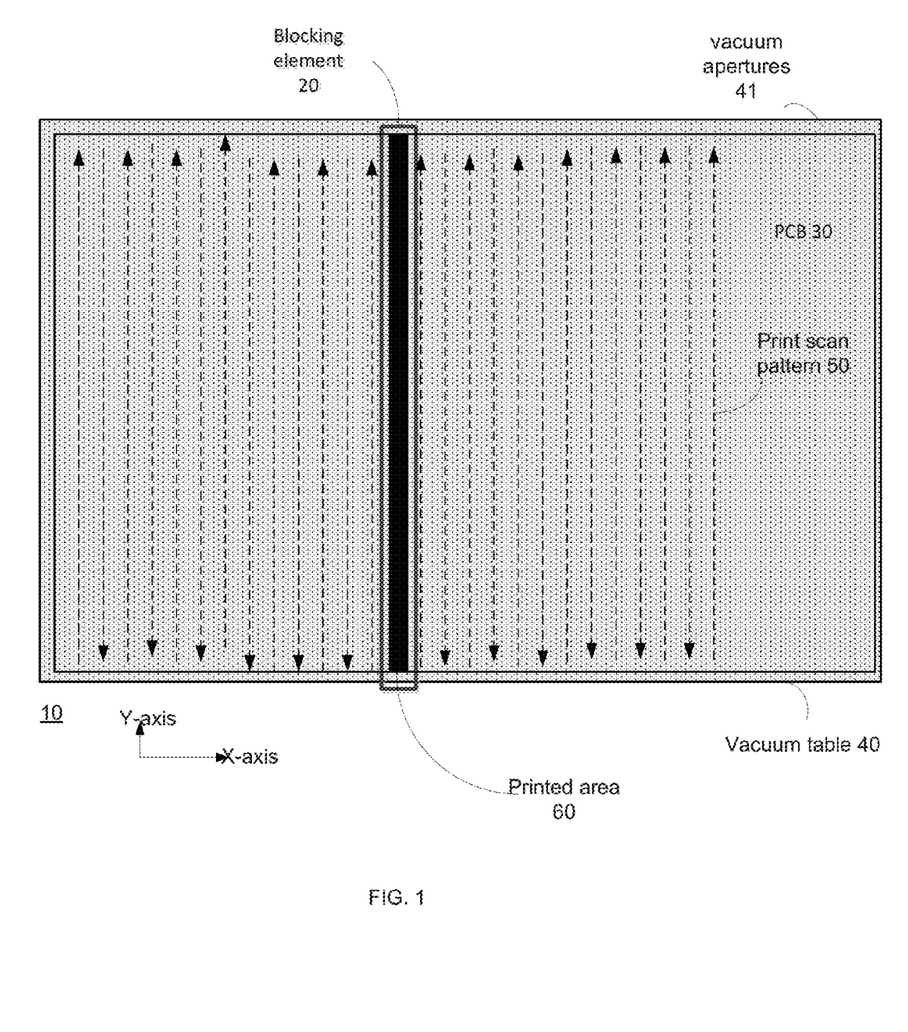
FIGS. 1-11 illustrate various portions of a printer according to various embodiments of the invention.

FIG. 1 is a top view of a PCB 30, of a vacuum table 40 and of a blocking element of a printer according to an embodiment of the invention.

It is assumed that the printing process involves performing a raster scan pattern or otherwise performs a print scan pattern 50 that includes printing one column of the PCB after the other—as illustrated by long and elongated printed area 60. The blocking element 20 is located at the intermediate layer of the printer 10 and thus prevents vacuum from being applied to the printed area during the printing of the printed area.

In FIG. 1 the blocking element 20 slightly exceeds the printed area 60 but may be equal in shape and size to the printed area 60.

It is noted that during the printing of the printed area the print head (not shown) may be static or may be moved along the Y-axis. Additionally or alternatively, the PCB can be static or may be moved along the Y-axis.

Figure 2:
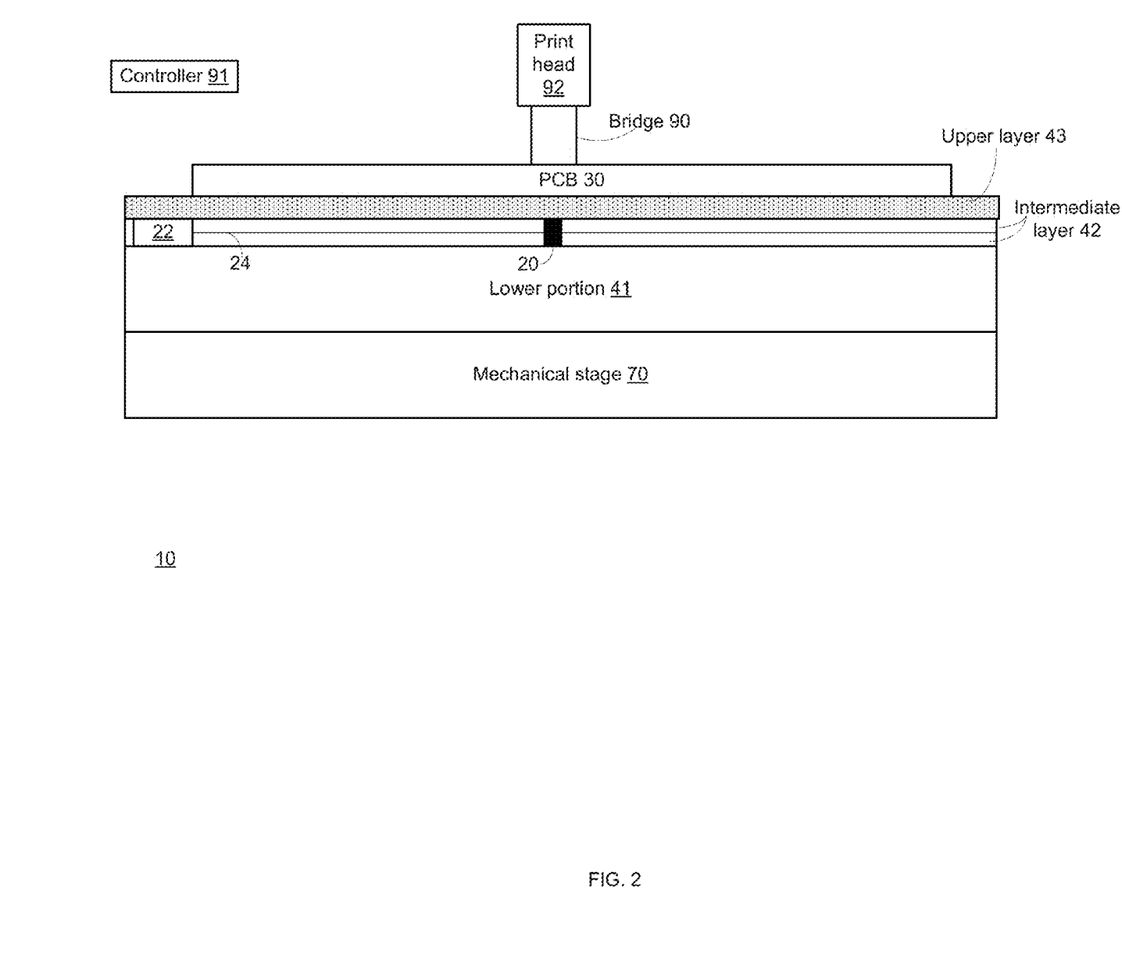

FIG. 2 is a cross sectional view of printer 10 according to an embodiment of the invention.

Printer 10 is illustrated as including, among other components, a controller 91 for controlling the printing process and the positioning of the blocking element 20. The print head 92 is coupled to a bridge 90 that is positioned above the PCB 30.

The PCB 30 is positioned on porous or apertured upper layer 43 of the vacuum table (or of a chuck).

Blocking element 20 may move along a threaded shaft 24 that is rotated by engine 22—all positioned within intermediate layer 42 of vacuum table.

A lower portion 41 of the vacuum table supplies vacuum to the intermediate layer and the vacuum is provided to upper layer 43 unless blocked by blocking element 20.

Any other type of engine may be applied for moving the blocking element 20.

The blocking element 20 may include a path for allowing vacuum to propagate from one side (facing the motor) to the opposite side. Said path may be useful when the lower portion 41 supplies the vacuum via one side of the blocking element.

A mechanical stage 70 may move the vacuum table and hence the PCB 30 in relation to the print head 92.

Any amount of print heads and/or bridges may be provided. The bridge is only an example for a mechanical interface that supports the print head 92.

FIGS. 3-11 illustrates various portions of printer 11 and a PCB 30 according to various embodiments of the invention.

Figure 3:
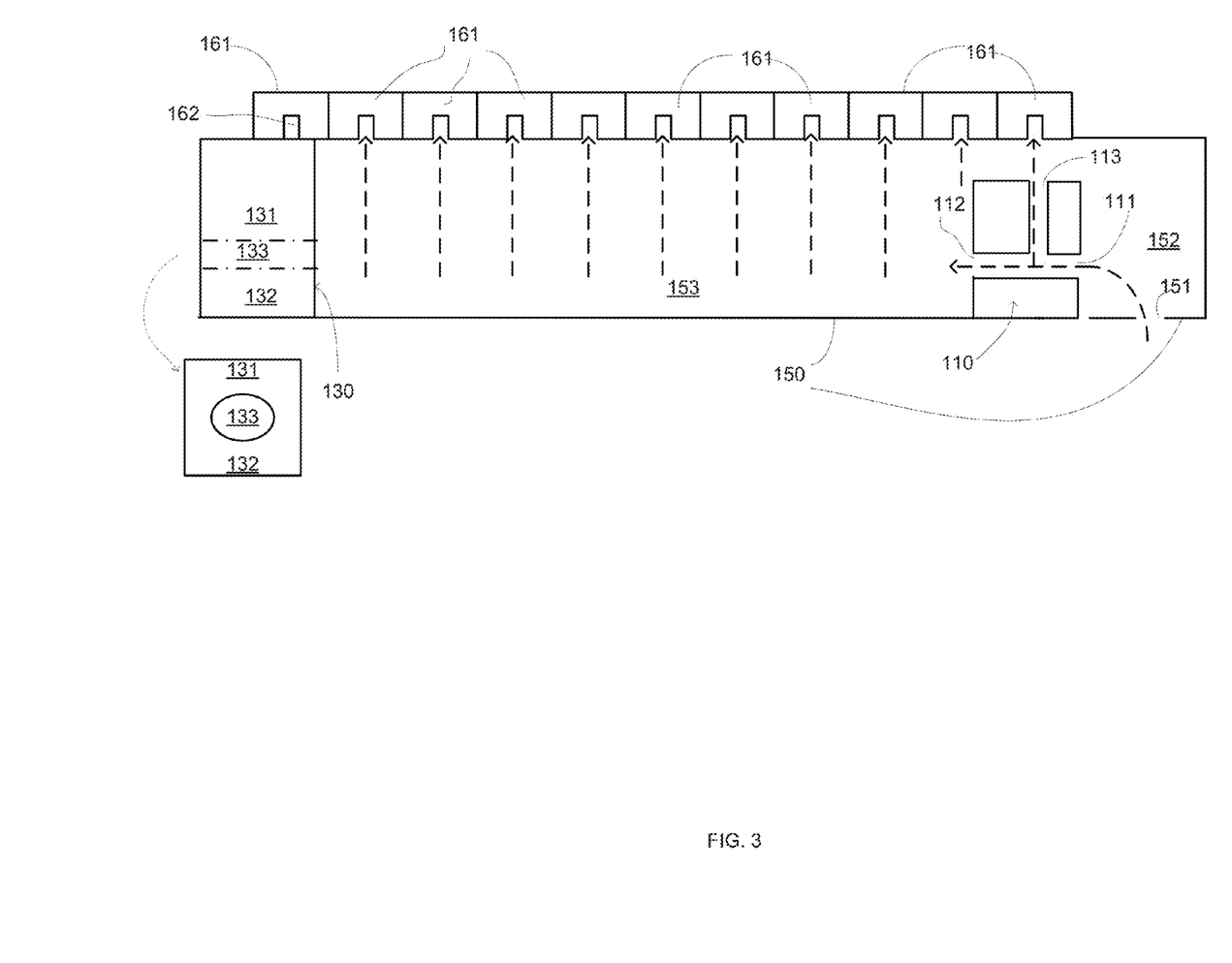

FIG. 3 illustrates printer 11 as including a chamber 150 that includes an input 151 (within chamber portion 152) for receiving vacuum (for example from lower portion 41 of FIG. 1), chamber sidewalls and an apertured or porous cover 160 that includes various openings (such as openings 162 in FIGS. 10 and 11) that lead to tunnels 161.

Input module 110 and blocking element 130 are positioned within chamber 150. The position of the blocking element 130 within chamber determines which apertures or pores 162 of apertured or porous cover 160 will be prevented from receiving vacuum.

Figure 4:
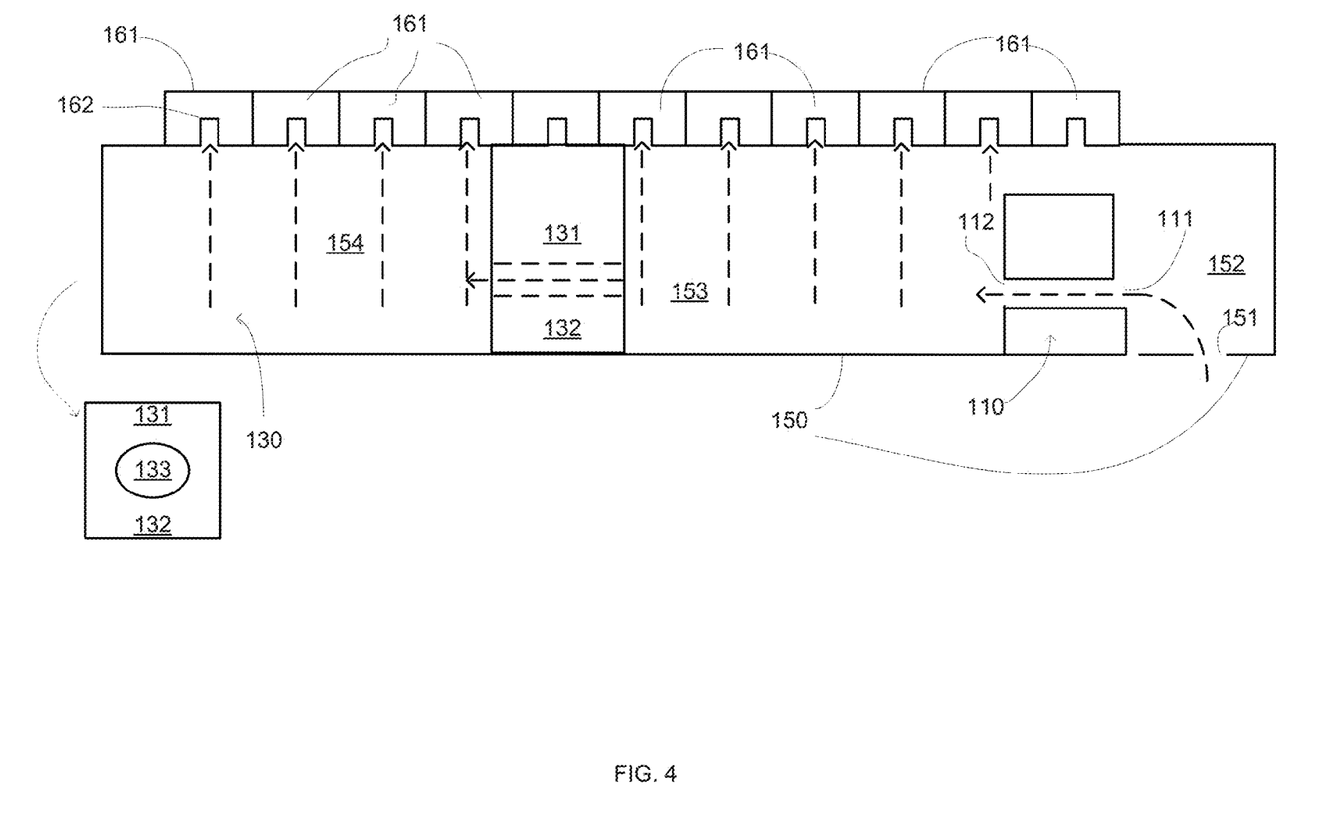

In FIGS. 3-4 a top of the blocking element 130 contacts one or more apertures or pores and prevents the provision of vacuum to the one or more apertures or pores and thus prevents vacuum from reaching printed area (denoted 60 in FIG. 1).

Instead of contacting said one or more apertures or pores, blocking element 130 may seal these one or more apertures or pores by sealing elements.

In FIGS. 3-4 the blocking element 130 has a path 133 for allowing vacuum to pass from (a) chamber portion 152 defined between the blocking element 130 and input module 110 and (b) chamber portion 153 defined between blocking element 130 and a left sidewall of chamber 150.

There are multiple tunnels 161 (or other vacuum conduits) that are oriented (for example normal to) the chamber 150 longitudinal axis—each tunnel 161 has an aperture 162 that is formed at the top of chamber and can be blocked by blocking element 130.

In FIGS. 3-4 the blocking element 130 is illustrated as including path 133 at its center and between parts 131 and 132 of blocking element 130.

In FIG. 3 the input module 110 includes inlet 111 and outlets 112 and 113. Outlet 112 is for providing vacuum from chamber portion 152 to chamber portion 153. Outlet 113 is for proving vacuum to one or more apertures or pores positioned above input module 110.

In FIG. 3 the input module includes inlet 111 and outlet 112 but does not include outlet 113.

In FIG. 3 the blocking element 130 is positioned at a leftmost position and the printer area (not shown) is positioned at the left edge of the PCB while in FIG. 4 the blocking element is positioned at an intermediate position and the printed area 60 is positioned somewhere at the middle of the PCB. When the printing pattern starts from left of the PCB and continued rightwards—FIG. 3 illustrates an earlier phase of the printing process in relation to FIG. 4.

Input module 110 receives the vacuum that enters via opening 151

Figure 5:
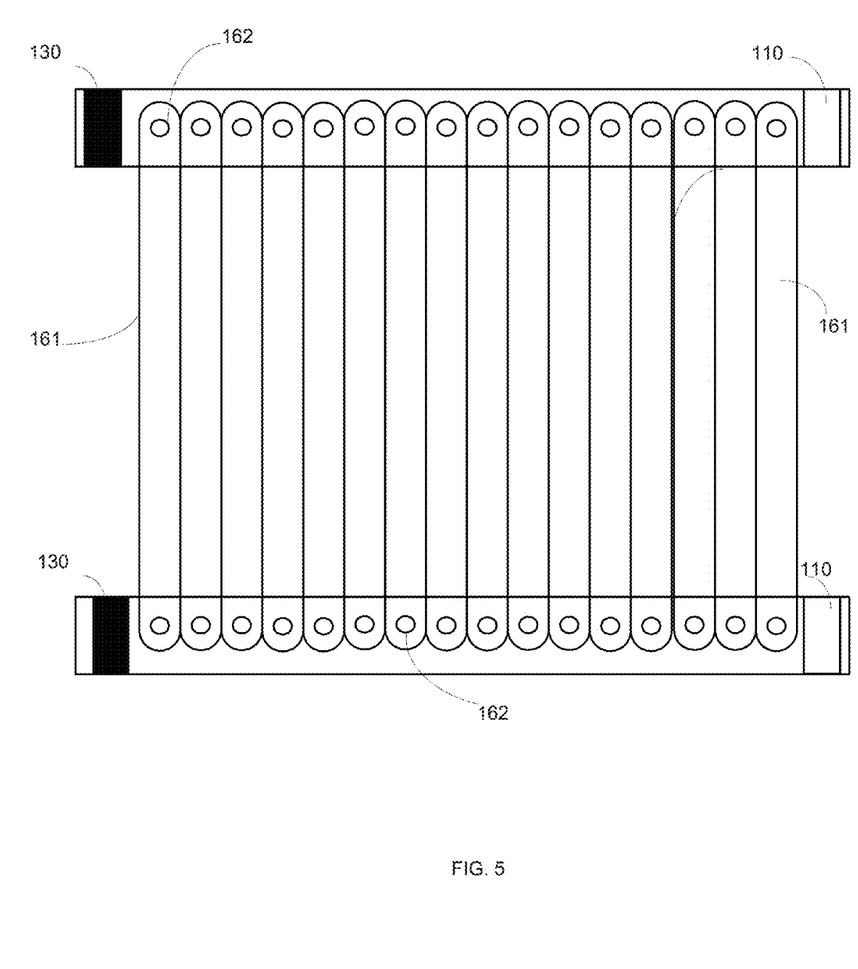
Figure 6:
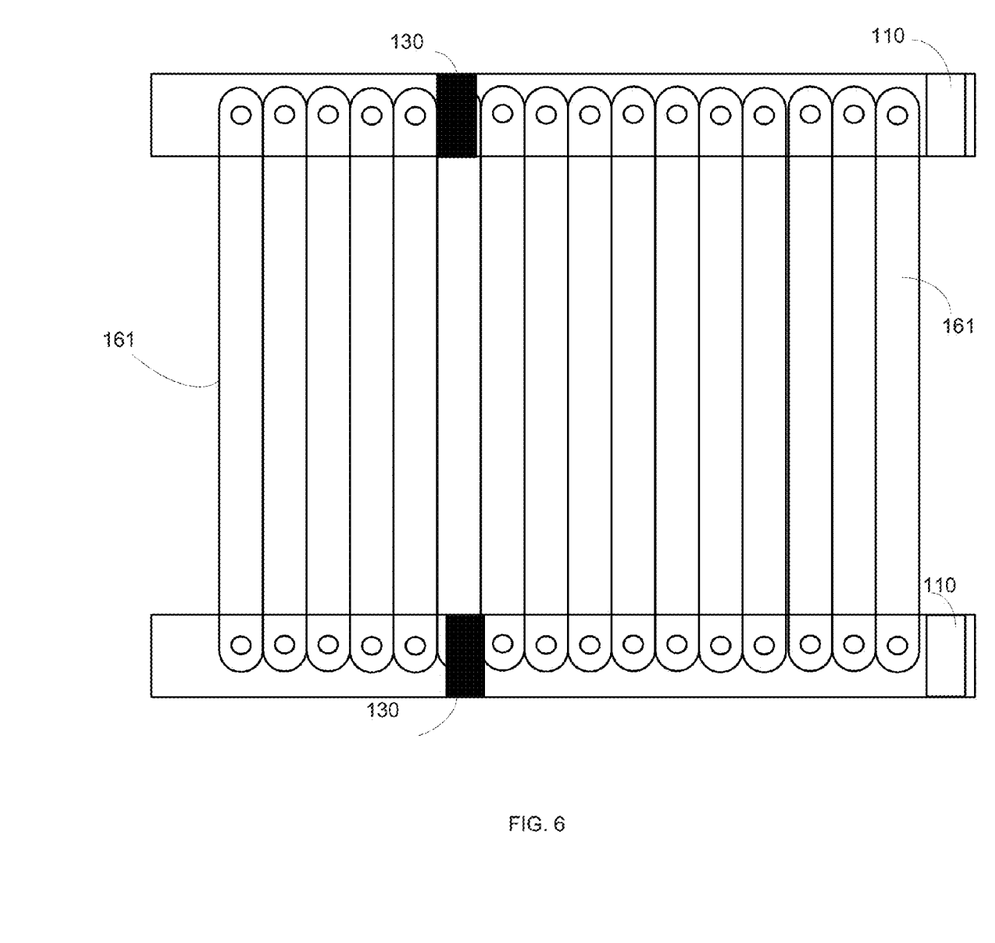

FIGS. 5 and 6 illustrate two chambers 150. Each chamber 150 includes an input module 110 and a blocking module 130.

Printer 11 includes tunnels 161. Each tunnel 161 has two apertures 162—one aperture per chamber 150—wherein vacuum can enter the tunnel 161 via one aperture 162 or both apertures 162.

Blocking elements 130 usually block the apertures 162 of the same tunnel 161 at a given point of time.

Figure 7:
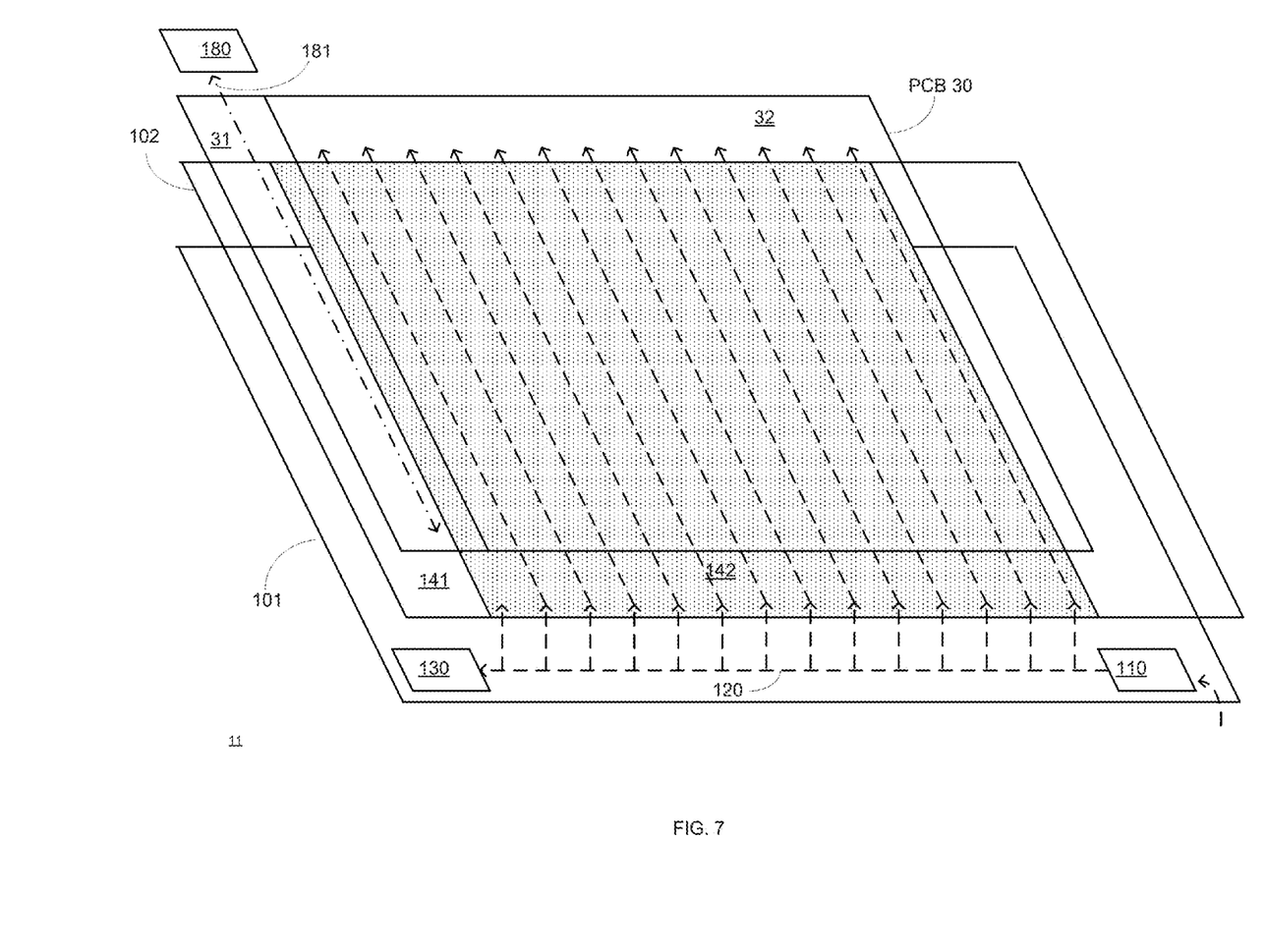
Figure 8:
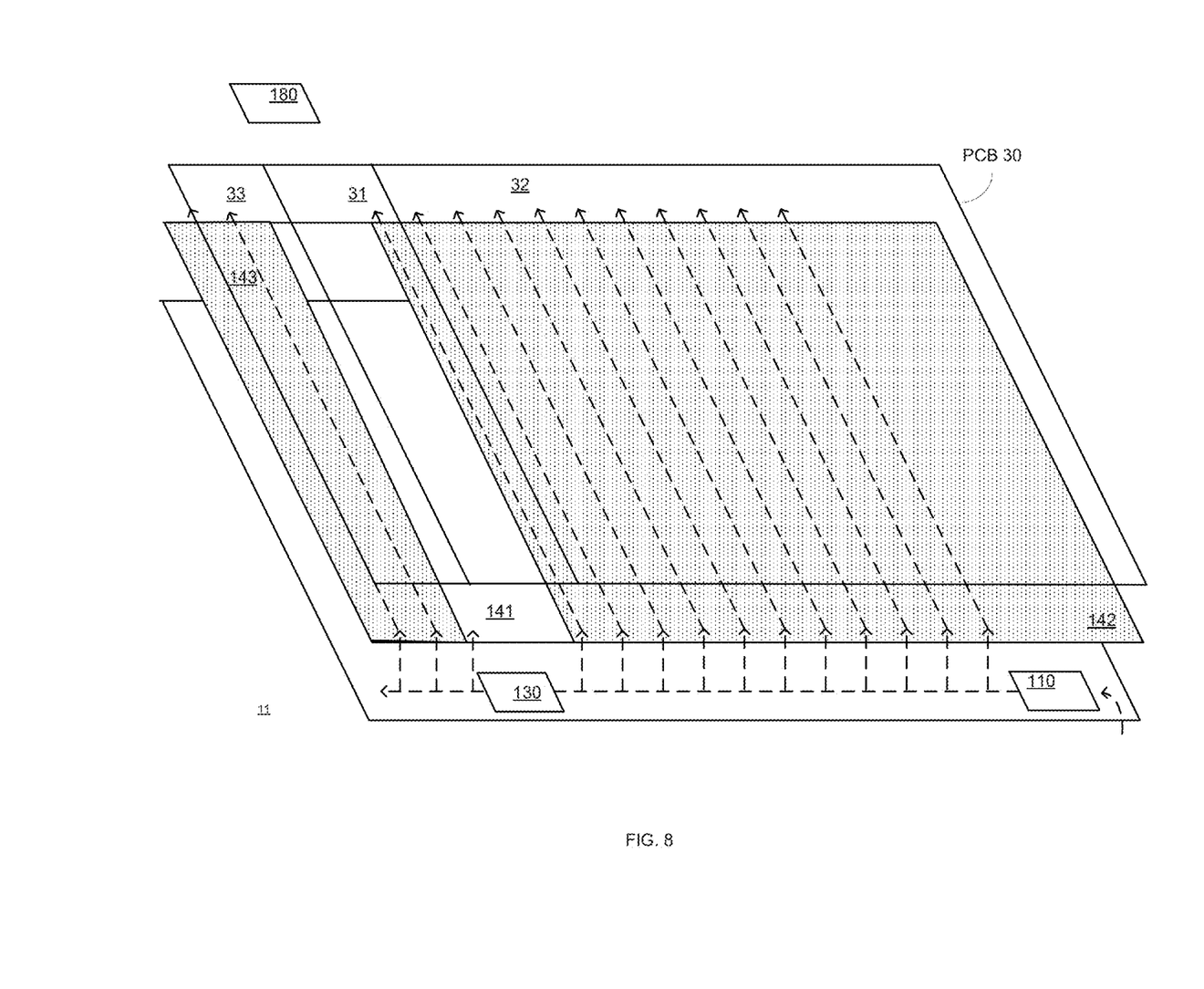

FIGS. 7 and 8 illustrate PCB 30, print head 180, print axis 181 and various parts of a printer 11 according to an embodiment of the invention.

In FIG. 7 the blocking module 130 is at a leftmost position and blocks a leftmost area 141 of an upper layer of a print table and thus a left most area 31 of the PCB (which is a printed area) is prevented from receiving vacuum while another area 32 of the PCB (and area 142 of the upper layer) receive vacuum.

In FIG. 8 the blocking module 130 is at an intermediate position and blocks an intermediate area 141 of an upper layer of a print table. Accordingly—intermediate area 31 of the PCB (which is a printed area) is prevented from receiving vacuum while other areas 32 and 33 of the PCB (and areas 142 and 143 of the upper layer) receive vacuum.

Figure 9:
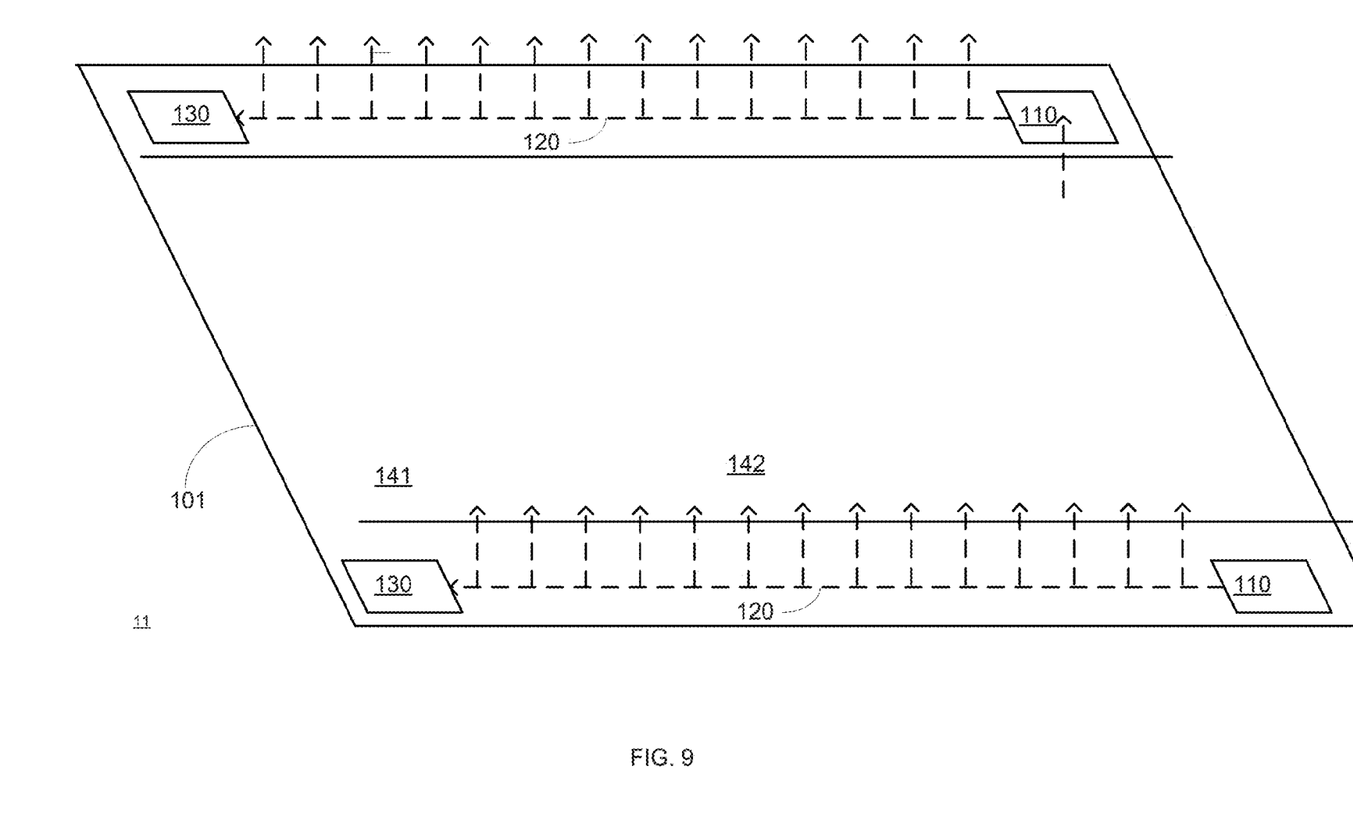

FIG. 9 illustrate printer 11 as including two chambers 150, each including an input module 110 and a blocking module 130.

Figure 10:
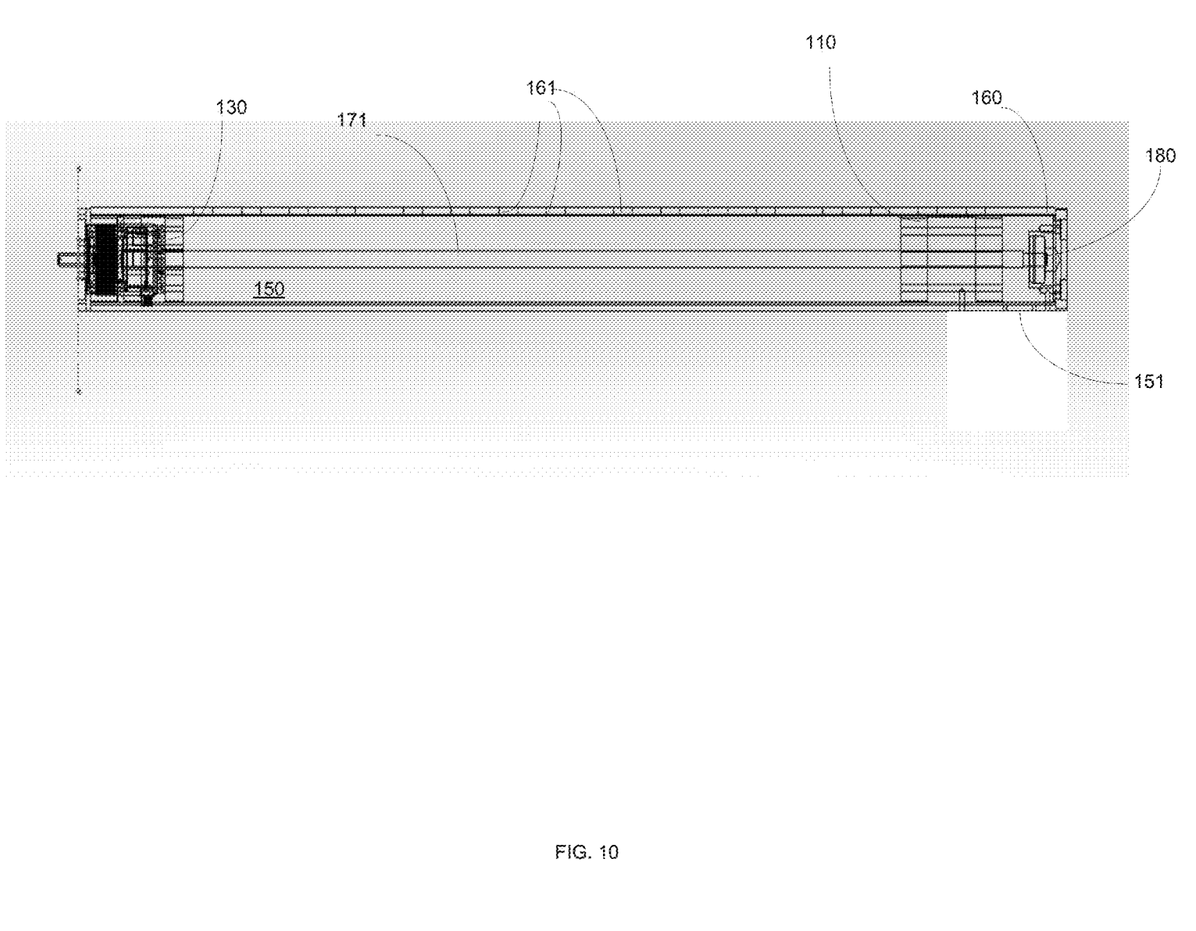

FIG. 10 is a cross sectional view of a chamber 150 according to an embodiment of the invention.

Chamber 150 surrounds blocking element 130, input module 110, motor 160 and a threaded shaft 171 that is rotated by motor 180 and which is interfaced by blocking element 130. The rotation of the threaded shaft 171 results in a linear movement of blocking element 130 along a longitudinal axis of chamber 150.

Figure 11:
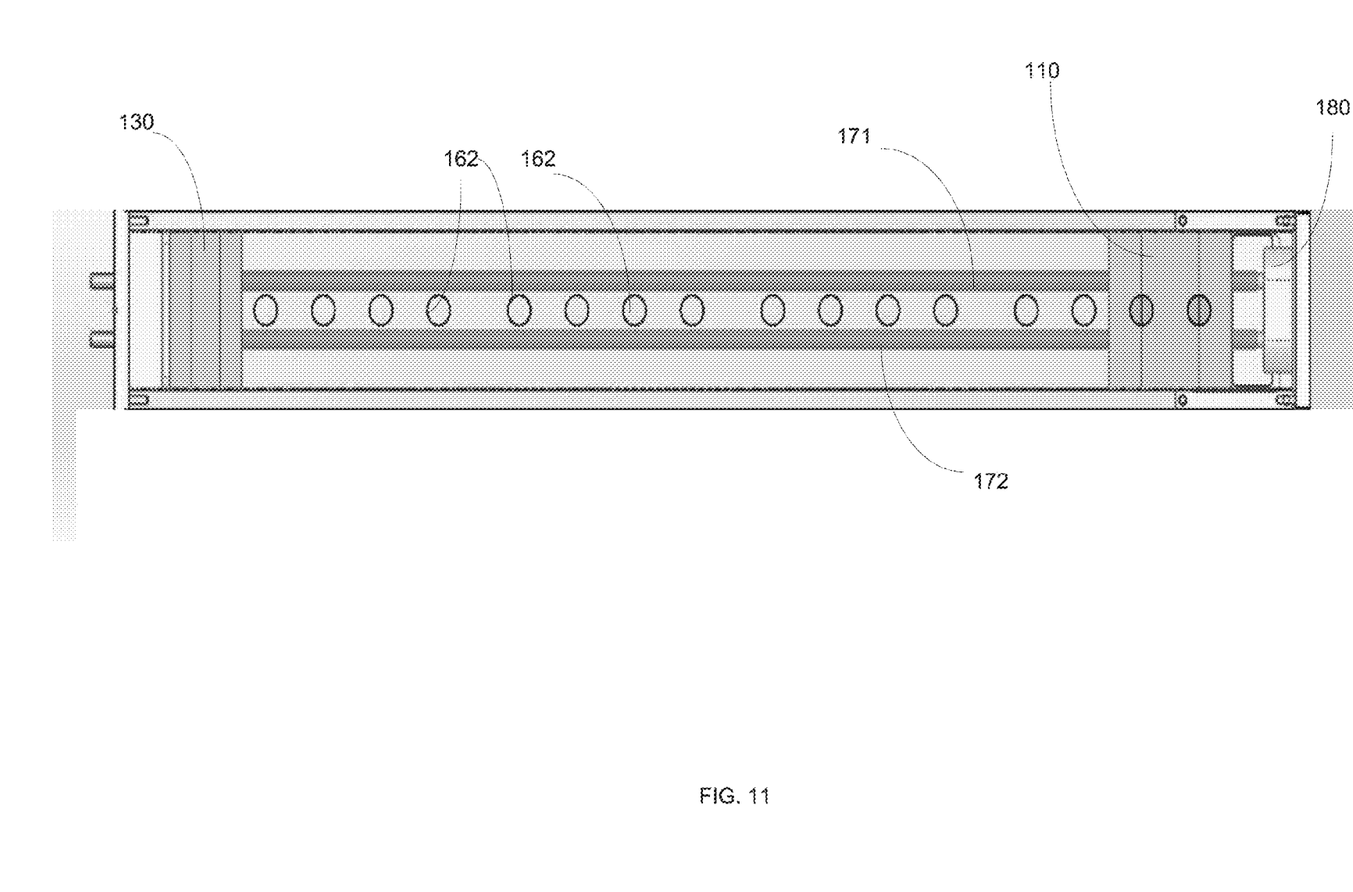

FIG. 11 is a top view of a chamber 150 according to an embodiment of the invention. FIG. 10 illustrates apertures 162, chamber 150 and two threaded shafts 171 and 172 that are concurrently rotated by motor 180 in order to perform a linear movement of blocking element 130 along a longitudinal axis of chamber 150.

There may be provided a method for printing material on a PCB, the method may include scanning a PCB with a printing head thereby printing material on one are of the PCB after the other while applying vacuum on areas of the PCB that are not printed, wherein the applying of the vacuum may include blocking vacuum from being applied at an area that is being printed.

Figure 12:
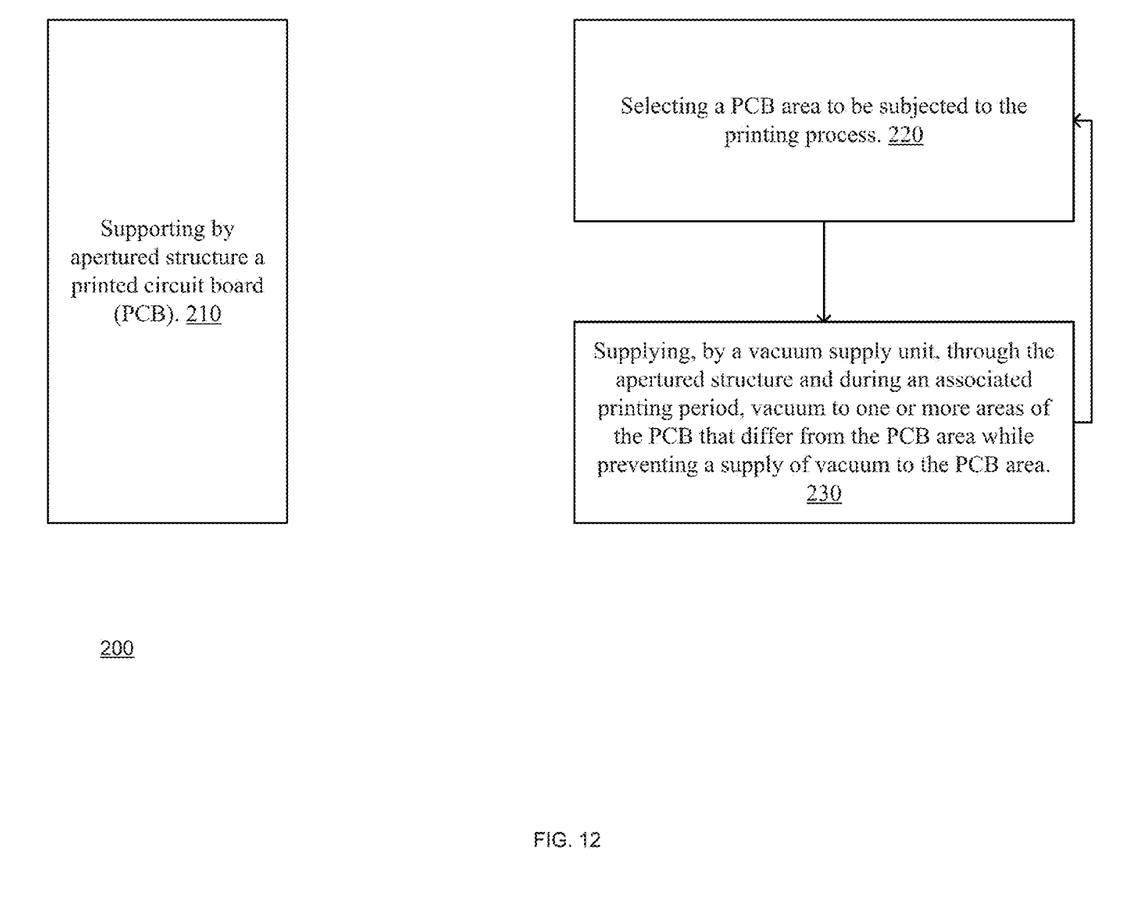
FIGS. 12-13 illustrate a method according to various embodiments of the invention.

FIG. 12 illustrates method 200 according to an embodiment of the invention.

Method 200 may start by step 210 of supporting by a porous or apertured structure a printed circuit board (PCB). The PCB includes multiple PCB areas, each PCB area is associated with an associated printing period.

If, for example, the PCB includes N (positive integer than exceeds one) PCB areas and each PCB area should be subjected to a printing process (during which one or more patterns are printed on the PCB area) then there may be N printing periods—each printing period is associated with a single PCB area.

Step 210 may be followed by step 220 of selecting a PCB area to be subjected to the printing process.

Step 220 may be followed by step 230 of supplying, by a vacuum supply unit, through the porous or apertured structure and during an associated printing period, vacuum to one or more areas of the PCB that differ from the PCB area while preventing a supply of vacuum to the PCB area.

For example, if the n'th PCB area should undergo a printing process during the n'th printing period then during the n'th printing period the vacuum supply unit prevents the n'th PCB area from receiving vacuum while supplying vacuum to one or more (preferably all) other PCB areas.

Step 230 may be followed by step 220. N iterations of steps 220 and 230 may "cover" the entire PCB areas.

Figure 13:
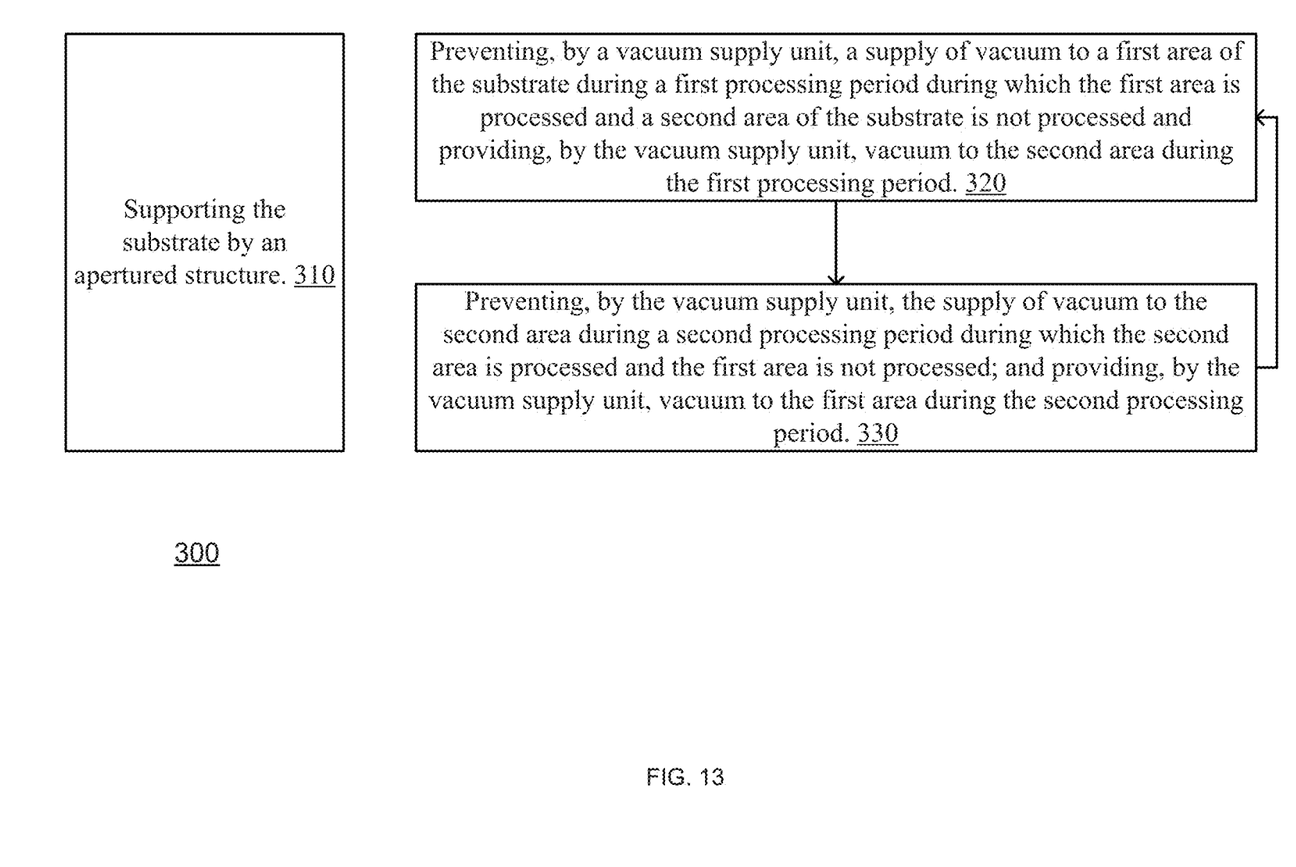

FIG. 13 illustrates method 300 according to an embodiment of the invention.

Method 300 is for selective supplying of vacuum to a substrate.

Method 300 may start by step 310 of supporting the substrate by an apertured structure.

In parallel to step 310, method 300 may also include steps 320 and 330 that represent two processing periods of two different areas of the substrate.

If the substrate includes more than two areas than method 300 may include more than two steps such as steps 320 and 330.

For example—when the substrate includes a group (J) of areas, group of areas includes the first areas, the second areas and at least one additional area. Each area of the group of areas (the j'th area, j ranging between 1 and J) is processed only during an associated processing period (the j'th processing period) of a group of processing periods. Method 300 may include preventing, during each processing period (the j'th processing period) of the group of processing periods and by the vacuum supply unit, the supply of vacuum to the area (the j'th area) of the substrate that is being processed and supplying vacuum to at least one area of the substrate that is not processed (an area that differs from the j'th area).

Step 320 may include preventing, by a vacuum supply unit, a supply of vacuum to a first area of the substrate during a first processing period during which the first area is processed and a second area of the substrate is not processed and providing, by the vacuum supply unit, vacuum to the second area during the first processing period.

Step 330 may include preventing, by the vacuum supply unit, the supply of vacuum to the second area during a second processing period during which the second area is processed and the first area is not processed; and providing, by the vacuum supply unit, vacuum to the first area during the second processing period.

Steps 320 and 330 may include selectively preventing, by a blocking module of the vacuum supply unit, the supply of vacuum, determining, by a positioning module of the vacuum supply unit, a position of the blocking module.

Step 320 may include positioning the blocking module, by the positioning module and during the first processing period, at a first position thereby blocking a first conduit of the vacuum supply unit thereby preventing a supply of vacuum to the first area of the substrate.

Step 330 may include positioning the blocking module, by the positioning module and during the second processing period, at a second position thereby blocking a second conduit of the vacuum supply unit thereby preventing a supply of vacuum to the second area of the substrate.

The first and second conduits comprise first and second apertures. Step 320 may include blocking, by the blocking module, the first aperture during the first processing period and step 330 may include blocking, by the blocking module, the second aperture during the second processing periods.

The first and second conduits may be tunnels that are oriented to a longitudinal axis of chamber in which the blocking module moves.

Steps 320 and 330 may include selectively preventing, by multiple blocking modules of the vacuum supply unit, the supply of vacuum; and determining, by multiple positioning modules of the vacuum supply unit, positions of the multiple blocking modules.

The processing comprising removing material from the substrate.

The processing comprising printing material on the substrate.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The word "comprising" does not exclude the presence of other elements or steps then those listed in a claim. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

I claim:

1. A system, comprising:
an apertured structure that is configured to support a substrate;
a vacuum supply unit that comprises multiple blocking modules and multiple positioning modules that are configured to determine positions of the multiple blocking modules; wherein the vacuum supply is configured to:
prevent, by the multiple blocking modules, a supply of vacuum to a first area of the substrate during a first processing period during which the first area is processed and a second area of the substrate is not processed;
provide vacuum to the second area during the first processing period;
prevent the supply of vacuum to the second area during a second processing period during which the second area is processed and the first area is not processed; and
provide vacuum to the first area during the second processing period.

2. The system according to claim 1, comprising:
first conduits for providing vacuum to the first area of the substrate;
second conduits for providing vacuum to the second area of the substrate;
wherein the positioning modules are configured to position, during the first processing period, the blocking modules at first positions thereby blocking the first conduits; and
wherein the positioning modules are configured to position, during the second processing period, the blocking modules at second positions thereby blocking the second conduits.

3. The system according to claim 2, wherein the first conduits and the second conduits comprise first apertures and second apertures; wherein the blocking modules are configured to block the first apertures during the first processing period and to block the second apertures during the second processing periods.

4. The system according to claim 3, wherein the first conduits and the second conduits are tunnels that are oriented to a longitudinal axis of chamber in which the blocking module moves.

5. The system according to claim 1, wherein the processing comprising removing material from the substrate.

6. The system according to claim 1, wherein the processing comprising printing material on the substrate.

7. The system according to claim 1, wherein the substrate comprises a group of areas; wherein the group of areas includes the first areas, the second areas and at least one additional area; wherein each area of the group of areas is processed only during an associated processing period of a group of processing periods; wherein during each processing period of the group of processing periods, the vacuum supply unit is configured to prevent the supply of vacuum to the area of the substrate that is being processed and supply vacuum to at least one area of the substrate that is not processed.

8. The system according to claim 1, wherein the blocking modules have a size that varies according to a strength of vacuum applied by the vacuum supply unit.

9. The system according to claim 1, wherein the blocking modules have a size that varies according to an accuracy of printing.

10. The system according to claim 1, wherein the blocking mechanisms are placed underneath an upper surface of the apertured structure.

11. The system according to claim 1, wherein the blocking mechanisms are formed at an upper surface of the apertured structure.

* * * * *